US010984983B2

(12) United States Patent
Gamm et al.

(10) Patent No.: US 10,984,983 B2
(45) Date of Patent: Apr. 20, 2021

(54) PARTICLE BEAM SYSTEM AND METHOD FOR OPERATING A PARTICLE BEAM SYSTEM

(71) Applicant: Carl Zeiss Microscopy GmbH, Jena (DE)

(72) Inventors: Björn Gamm, Koenigsbronn (DE); Marko Matijevic, Nuertingen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/705,953

(22) Filed: Dec. 6, 2019

(65) Prior Publication Data

US 2020/0185191 A1 Jun. 11, 2020

(30) Foreign Application Priority Data

Dec. 10, 2018 (DE) .......................... 102018131609.7

(51) Int. Cl.
*H01J 37/304* (2006.01)
*H01J 37/244* (2006.01)

(52) U.S. Cl.
CPC .......... *H01J 37/304* (2013.01); *H01J 37/244* (2013.01); *H01J 2237/047* (2013.01); *H01J 2237/2448* (2013.01); *H01J 2237/30416* (2013.01)

(58) Field of Classification Search
CPC .. H01J 37/304; H01J 37/244; H01J 2237/047; H01J 2237/2448; H01J 2237/30416
See application file for complete search history.

(56) References Cited

U.S. PATENT DOCUMENTS

| 5,164,594 A | 11/1992 | Thompson et al. |
| 5,677,530 A | 10/1997 | Sato et al. |
| 6,452,173 B1 | 9/2002 | Oi |
| 8,314,410 B2 * | 11/2012 | Straw .................... H01J 37/28 250/492.3 |

(Continued)

FOREIGN PATENT DOCUMENTS

| DE | 696 24 192 T2 | 3/1997 |
| DE | 10 2006 059 162 A1 | 6/2008 |

(Continued)

OTHER PUBLICATIONS

German Office Action, with translation thereof, for corresponding DE application No. 10 2018 131 609.7 dated Aug. 12, 2019.

*Primary Examiner* — Sean M Luck
(74) *Attorney, Agent, or Firm* — Fish & Richardson P.C.

(57) ABSTRACT

A particle beam system includes first and second particle beam columns. In a first operating mode, an end cap having an opening therein is outside a beam path of a first particle beam. In a second operating mode, the beam path of the first particle beam can extend through the opening of the end cap so that secondary particles coming from a work region can pass through the opening of the end cap to a detector in the interior of the first particle beam column. While the particle beam system is in the first operating mode, an image of an object arranged in the work region is recorded using the first particle beam column. While the particle beam system is in the second operating mode, the object is processed using a second particle beam.

21 Claims, 5 Drawing Sheets

(56) References Cited

U.S. PATENT DOCUMENTS

| | | | |
|---|---|---|---|
| 2006/0016988 A1* | 1/2006 | Petrov | H01J 37/28 |
| | | | 250/310 |
| 2009/0309025 A1 | 12/2009 | Preikszas | |
| 2010/0133433 A1* | 6/2010 | Tanimoto | H01J 37/244 |
| | | | 250/310 |
| 2011/0068265 A1* | 3/2011 | Arai | H01J 37/28 |
| | | | 250/306 |
| 2011/0220788 A1 | 9/2011 | Laue et al. | |
| 2012/0112062 A1* | 5/2012 | Novak | H01J 37/244 |
| | | | 250/307 |
| 2015/0348742 A1 | 12/2015 | Albiez et al. | |
| 2017/0154752 A1 | 6/2017 | Essers et al. | |

FOREIGN PATENT DOCUMENTS

| | | |
|---|---|---|
| DE | 10 2010 001 349 A1 | 8/2011 |
| JP | H11-25895 A | 3/1996 |

\* cited by examiner

PARTICLE BEAM SYSTEM AND METHOD FOR OPERATING A PARTICLE BEAM SYSTEM

CROSS-REFERENCE TO RELATED APPLICATIONS

This application claims benefit under 35 U.S.C. § 119 to German Application No. 10 2018 131 609.7, filed Dec. 10, 2019. The contents of this application is hereby incorporated by reference in its entirety.

FIELD

The disclosure relates to a particle beam system for processing an object and to a method for operating a particle beam system.

SUMMARY

The present disclosure seeks to provide a particle beam system and a method for operating a particle beam system with which an object can be processed with the greatest possible precision.

One aspect of the present disclosure relates to a particle beam system for processing an object. The particle beam system includes a first particle beam column and a second particle beam column having a common work region. The first particle beam column is configured to produce a first particle beam, and the second particle beam column is configured to produce a second particle beam. An object that is to be processed can be arranged in the common work region, as a result of which both the first particle beam and the second particle beam can be directed (at the same time) onto the same region of the object. A main axis of the first particle beam column and a main axis of the second particle beam column can be arranged at an angle of approximately 54° with respect to one another.

The first particle beam column includes in its interior one or more detectors for detecting secondary particles. To simplify the description, the detector will be referred to below only in its singular form. Secondary particles can be produced both by interaction of the first particle beam with the object and also by interaction of the second particle beam with the object. Here, secondary particles refer in particular to back-scattered electrons, secondary electrons or secondary ions.

The particle beam system furthermore includes an end cap having an opening arranged therein.

The particle beam system can be operated in a first operating mode. In the first operating mode, the end cap is located outside a beam path of the first particle beam. In addition, the end cap in the first operating mode is located outside a beam path of the second particle beam, with the result that the end cap in the first operating mode has substantially no influence on the beam paths of the first particle beam and of the second particle beam or on the trajectories of the secondary particles.

The particle beam system can furthermore be operated in a second operating mode. In the second operating mode, the end cap is arranged such that the beam path of the first particle beam can pass through the opening of the end cap, and that secondary particles coming from the common work region can pass through the opening of the end cap to the detector in the first particle beam column. If the first particle beam in the second operating mode is directed onto the object, the first particle beam consequently passes through the opening of the end cap. In the second operating mode, the secondary particles that pass to the detector in the first particle beam column furthermore pass through the opening of the end cap.

The first particle beam column can be an electron beam column, which means that the first particle beam can be an electron beam. Alternatively, the first particle beam column can be an ion beam column, which means that the first particle beam can be an ion beam.

The second particle beam column can be an electron beam column, which means that the second particle beam can be an electron beam. Alternatively, the second particle beam column can be an ion beam column, which means that the second particle beam can be an ion beam.

The first particle beam column can include at least one electrode which produces an electrostatic field, wherein the electrostatic field is suited to decelerate or accelerate the first particle beam. The electrostatic field can be produced such that at least a portion of the field is situated between an exit opening, through which the first particle beam can exit the first particle beam column, and the object while the particle beam system is in the first operating mode. Consequently, the electrostatic field furthermore has the effect that the secondary particles coming from the object are accelerated to the detector which is arranged in the first particle beam column, as a result of which a high quantity of secondary particles can be detected. As a result, the first particle beam column in the first operating mode provides a very high resolution for recording images of the object. However, the electrostatic field here has the disadvantage that it also acts on the second particle beam and thus influences the beam path of the second particle beam, for which reason the precision with which the second particle beam can be directed onto the object is decreased in the first operating mode by the electrostatic field.

In the second operating mode, the strength of the electrostatic field in the common work region is lowered by the arrangement of the end cap between the first particle beam column and the object, with the result that the influence of the electrostatic field on the second particle beam in the second operating mode is lower than in the first operating mode. Consequently, the second particle beam can be directed onto the object with greater precision in the second operating mode. Even though the electrostatic field in the common work region is weaker in the second operating mode than in the first operating mode, secondary particles are still accelerated to the detector arranged in the first particle beam column in a sufficient quantity such that secondary particles can still be detected with this detector during the second operating mode.

As a result, the particle beam system provides the first operating mode, in which the first particle beam column operates with very high precision, and the second operating mode, in which the second particle beam column operates with very high precision. Consequently, the secondary particles detected during the first operating mode can be used to produce image data that represent a highly precise image of the object. These image data can then be used for controlling the second particle beam or the second particle beam column in the second operating mode, in which the second particle beam can be directed onto the object with very high precision.

For controlling the process in the particle beam system, the latter can have a controller that is configured such that it causes the particle beam system to perform the methods described here.

A further aspect of the present disclosure relates to a method for operating a particle beam system, in particular for operating the particle beam system that is described here. The method includes a first sequence and a second sequence. At the beginning of the first sequence, the particle beam system is brought into the first operating mode so that all further steps which are performed in the course of the first sequence are performed in the first operating mode. At the beginning of the second sequence, the particle beam system is brought into the second operating mode so that all further steps which are performed in the course of the second sequence are performed in the second operating mode.

According to an exemplary embodiment, the first sequence includes detecting the secondary particles coming from an object that is arranged in the common work region using the at least one detector which is arranged in the first particle beam column, while the particle beam system is in the first operating mode. In this way, a highly precise image of the object can be produced during the first sequence. The second sequence includes processing the object with the second particle beam, while the particle beam system is in the second operating mode, in particular based on the secondary particles that were recorded in the course of the first sequence. In this way, the object can be processed with great precision with the second particle beam, in particular based on an image that is based on the secondary particles that were recorded with great precision in the course of the first sequence.

According to a further embodiment, the method furthermore includes producing an electrostatic field by way of the first particle beam column for the duration of the first and second sequences, wherein the field is suited to decelerate or accelerate the first particle beam. An electrostatic field decelerating the particle beam has two substantial effects. First, the particles of the first particle beam can pass through the first particle beam column with a high kinetic energy (for example 10 keV) before they exit therefrom. This reduces the effect of the Coulomb interaction between the particles of the first particle beam, which results in a greater precision of the first particle beam column. The particles of the first particle beam that have been decelerated by the electrostatic field do not damage the object, or damage the object to a lesser extent, because the particles of the first particle beam have been decelerated by the electrostatic field. An electrostatic field that accelerates the particle beam can contribute to the improvement of/change in the contrast of a recorded image of the object, in particular if a positive voltage is applied to the object.

The further substantial effect of the electrostatic field is that the secondary particles that have been produced owing to the interaction of the first particle beam and/or of the second particle beam with the object are accelerated to the at least one detector that is arranged in the first particle beam column, as a result of which a large quantity of the produced secondary particles can be detected, which in turn improves the precision of the images of the object that can be produced with the detected secondary particles.

For the duration of the production of the electrostatic field, the voltage or voltages or the electric potential or the electric potentials that are applied to the electrode(s) (and to the object) to produce the electrostatic field are kept substantially constant. It is accordingly not necessary to change the voltages or potentials during the first and second sequence.

The electrostatic field can be produced such that at least a portion of the field is situated between an exit opening, through which the first particle beam can exit the first particle beam column, and the object while the particle beam system is in the first operating mode. In this way, the secondary particles coming from the object can be efficiently detected.

In the second operating mode, the end cap is arranged between the first particle beam column and the object. For example, the end cap can be arranged between the exit opening of the first particle beam column and the object to bring the particle beam system into the second operating mode. Hereby, the strength of the electrostatic field in the work region is reduced compared to the case in which the particle beam system is in the first operating mode. As a result, the strength of the electrostatic field negatively influencing the precision of the second particle beam column decreases in the second operating mode in the common work region.

According to one embodiment, the first sequence furthermore includes bringing the particle beam system into the first operating mode. For example, the particle beam system is brought into the first operating mode by arranging the end cap outside the beam path of the first particle beam.

According to an exemplary embodiment, the second sequence includes bringing the particle beam system into the second operating mode. The particle beam system can be brought into the second operating mode for example by arranging the end cap between the first particle beam column and the work region.

According to further exemplary embodiments, the first sequence can include the further following steps: producing image data representing an image of the object based on the secondary particles that were detected in the first sequence; and/or directing the second particle beam and/or the first particle beam onto the object while the particle beam system is in the first operating mode to produce the secondary particles coming from the object; and/or processing the object using the second particle beam while the particle beam system is in the first operating mode. These steps can be performed one after the other or at the same time and repeatedly during the first sequence.

According to further exemplary embodiments, the second sequence includes the further following steps: detecting the secondary particles that are coming from the object and pass through the opening of the end cap using the at least one detector that is arranged in the first particle beam column while the particle beam system is in the second operating mode; and/or producing image data representing an image of the object based on the secondary particles that were detected in the second sequence; and/or directing the second particle beam and/or the first particle beam that travels through the opening of the end cap onto the object while the particle beam system is in the second operating mode to produce the secondary particles coming from the object. These steps of the second sequence can be performed one after the other or at the same time and repeatedly in the second sequence.

According to further embodiments, the first sequence is performed before, in particular immediately before, the second sequence. Furthermore or alternatively, the first sequence can be performed after, in particular immediately after, the second sequence. Consequently, the first sequence can be performed before and/or after the second sequence and in particular repeatedly with the second sequence. Consequently, the first and second sequences can be repeated for example successively in alternation. The method can end for example by a termination condition being met.

BRIEF DESCRIPTION OF THE DRAWINGS

Embodiments of the disclosure are explained in greater detail below with reference to figures, in which.

DESCRIPTION OF EXEMPLARY EMBODIMENTS

Figure 1:
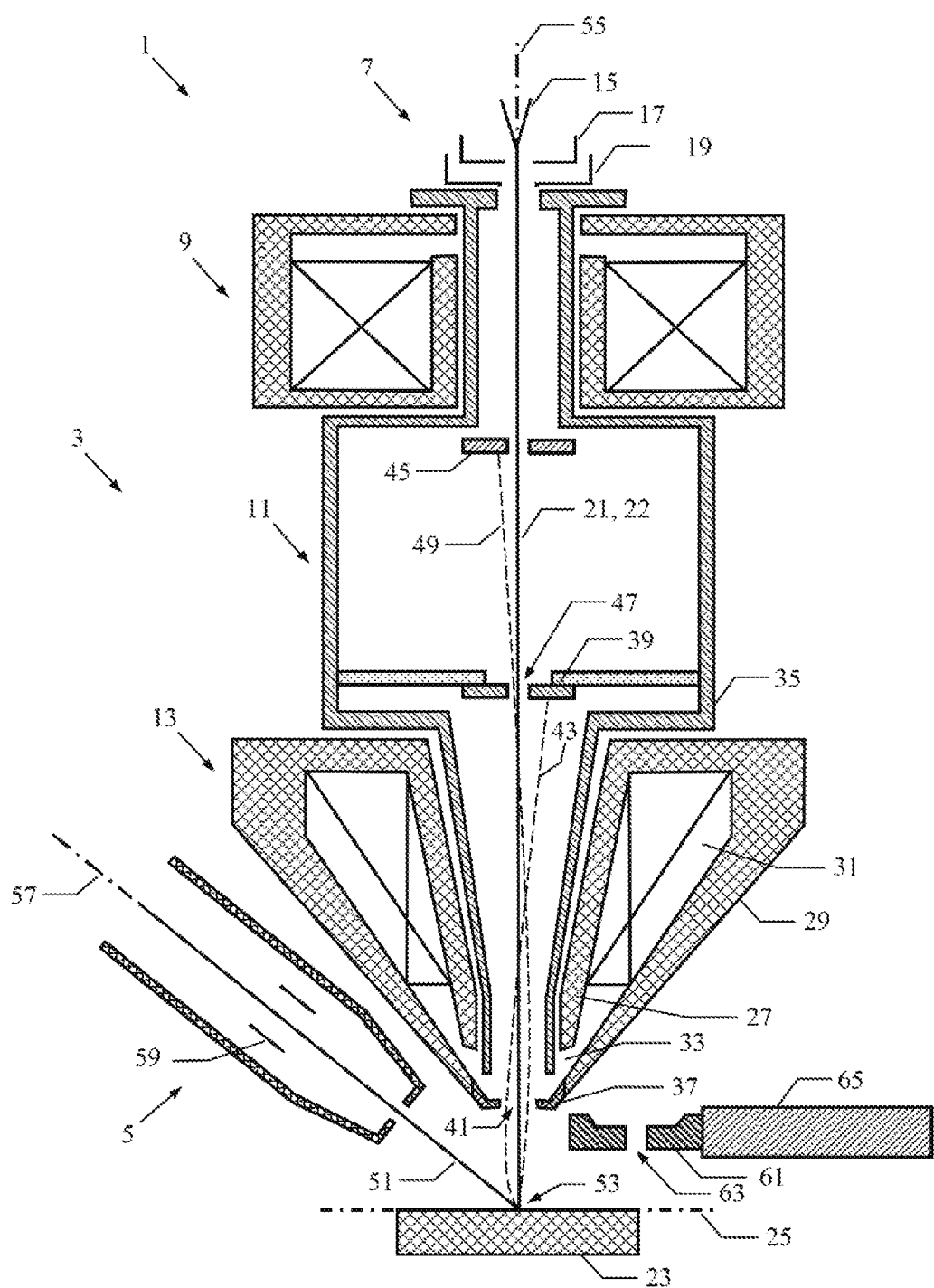
FIG. 1 shows a particle beam system according to an embodiment in a first operating mode.

FIG. 1 shows a particle beam system 1 according to an embodiment in a first operating mode. The particle beam system 1 includes a first particle beam column. In the present example, the first particle beam column is an electron beam column 3, which is configured in the form of a scanning electron microscope. The particle beam system 1 furthermore includes a second particle beam column. In the present example, the second particle beam column is an ion beam column 5. However, the first particle beam column can also be ion beam column; and the second particle beam column can also be an electron beam column.

The electron beam column 3 includes a particle source 7, a condenser lens 9, a booster 11 and an objective lens 13. The particle source 7 includes a cathode 15, a suppression electrode 17 and an extraction electrode 19.

An electron beam 21, which extends between the cathode 15 and a surface of an object 23 that is to be examined or processed, is produced by the particle source 7.

The electron beam 21 extends through the condenser lens 9, the booster 11 and the objective lens 13. The electron beam column 3, in particular the objective lens 13, is configured such that the electron beam 21 is focused at an object plane 25 in which the object 23 is arranged or can be arranged.

The booster 11 is configured to surround part of the electron beam 21 such that the electrons of the electron beam 21 can traverse the booster 11 with a high kinetic energy, for example with a kinetic energy of 10 keV. As a result, spherical and chromatic aberrations of the electron beam 21 are minimized and the influence of disturbing fields is reduced.

The objective lens 13 includes an inner pole piece 27, an outer pole piece 29 and an exciter coil 31 to create a magnetic field in a gap 33 between the inner pole piece 27 and the outer pole piece 29. The objective lens 13 furthermore includes a first electrode 35, which is formed by an object-side end section of the booster 11, and a second electrode 37, which is located at an object-side end section of the outer pole piece 29. As a result, the objective lens 13 is a magnetic and electrostatic objective lens combined. The second electrode 37 can be electrically insulated from the outer pole piece 29 in such a way that electric potential can be applied to the second electrode 37 which differs from a potential that is applied to the outer pole piece 29.

The electron beam column 3 furthermore includes a first detector 39 for detecting secondary particles (in particular secondary electrons), wherein the first detector 39 is arranged within the booster 11 and consequently within the electron beam column 3. The first detector 39 is configured to detect secondary particles which have been produced owing to the interaction of the electron beam 21 with the object 23, enter the interior of the electron beam column 3 through an object-side exit opening 41 of the electron beam column 3 and are incident on the first detector 39. An exemplary trajectory 43 of a secondary electron is illustrated by way of a dashed line.

The electron beam column 3 includes a second detector 45 within the booster 11 for detecting secondary particles. The second detector is configured to detect secondary particles (in particular back-scattered electrons) that travel from the object 23 through the exit opening 41 into the interior of the objective lens 13 and through an opening 47 in the first detector 39 to be incident on the second detector 45. An exemplary trajectory 49 of a back-scattered electron is illustrated by way of a dashed line.

A first electric potential can be applied to the first electrode 35 and a second electric potential can be applied to the second electrode 37, with the second electric potential being smaller than the first electric potential. In this way, the electron beam 21, after passing through the booster 11 and before exiting from the electron beam column 3 through the exit opening 41, is decelerated, that is to say the kinetic energy of the electrons of the particle beam 21 is reduced. Alternatively, a first electric potential can be applied to the first electrode 35 and a second electric potential can be applied to the second electrode 37, with the second electric potential being greater than the first electric potential. In this way, the electron beam 21, after passing through the booster 11 and before exiting from the electron beam column 3 through the exit opening 41, is accelerated, that is to say the kinetic energy of the electrons of the particle beam 21 is increased.

In addition, a third electric potential that is smaller than or greater than the second potential of the second electrode 37 can be applied to the object 23.

By applying the aforementioned electric potentials to the first electrode 35 and the second electrode 37 (and the object 23), an electrostatic field is produced, which has the effect that the secondary particles that are generated by the interaction of the electron beam 21 with the object 23, in particular secondary electrons and back-scattered electrons, are accelerated towards the exit opening 41 and enter the interior of the electron beam column 3 by passing through the exit opening 41 and propagate in the interior until they are incident on the first detector 39 or the second detector 45. In this way, a large quantity of the secondary particles can be guided to the first detector 39 and the second detector 45, which has the result that the object 23 can, with this configuration of the electron beam column 3, be analysed with a very high spatial resolution.

The ion beam column 5 is configured to produce an ion beam 51, which is suitable for processing the object 23, in particular for removing material from the object 23 or cutting material off the object 23 with the infeed of a process gas. The electron beam column 3 and the ion beam column 5 have a common work region 53, in which a main axis 55 of the electron beam column 3 and a main axis 57 of the ion beam column 5 intersect. The ion beam column 5 includes deflectors 59 that can deflect the ion beam 51 so as to be able to process different sites of the object 23.

The ion beam 51 travels through the electrostatic field, which is produced between the second electrode 37 and the object 23 by the first electrode 35 and the second electrode 37. As a result, the ion beam 51, after exiting from the ion beam column 5, is deflected by the electrostatic field, which has a negative effect on the precision with which the ion beam 51 can be directed onto the object 23.

The particle beam system 1 furthermore includes an end cap 61. The end cap 61 has an opening 63, which may be smaller than the exit opening 41 of the electron beam column 3. The end cap 61 is connected to a movement apparatus 65, which is configured to position the end cap 61 outside a beam path 22 of the electron beam 21 (and outside a beam path of the ion beam 51), such that the end cap 61 does not obstruct the beam path 22 of the electron beam 21, the beam path of the ion beam 51 and the trajectories 43, 49 of the secondary particles through the exit opening 41. The state of the particle beam system 1, which is illustrated in FIG. 1 and in which the end cap 61 is arranged such that it does not obstruct the beam paths of the electron beam 21 and of the ion beam 51 nor the trajectories of the secondary particles that travel through the exit opening 41, is designated the first operating mode of the particle beam system 1.

Figure 2:
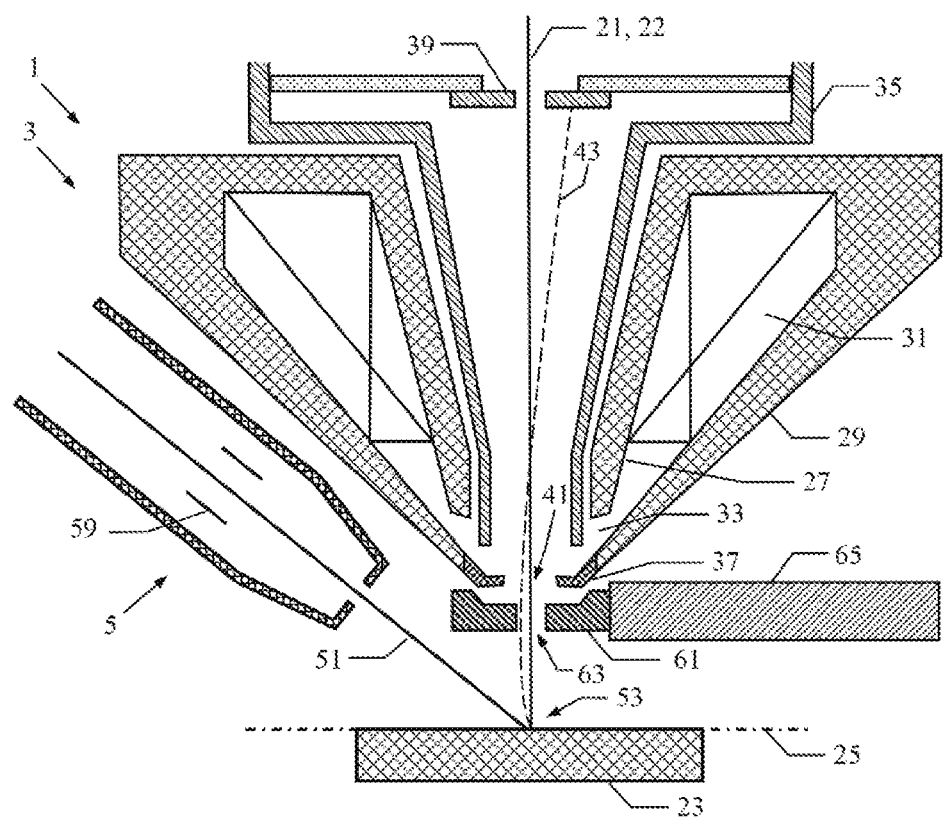
FIG. 2 shows a first illustration of the particle beam system shown in FIG. 1 in a second operating mode.

FIG. 2 shows a detail of the particle beam system 1 illustrated in FIG. 1 in a second operating mode. In the second operating mode of the particle beam system 1, the end cap 61 is arranged such that the beam path 22 of the electron beam 21 can pass through the opening 63 of the end cap 61, and that secondary particles coming from the common work region 53 can pass through the opening 63 of the end cap 61 to the detector 39. In the second operating mode of the particle beam system 1, the end cap 61 is arranged between the electron beam column 3 and the object 23, in particular between the objective lens 13 and the object 23, more particularly between the second electrode 37 and the object 23. The movement apparatus 65 is configured to correspondingly position the end cap 61 and to move it such that the particle beam system can be transitioned from the first operating mode into the second operating mode and from the second operating mode into the first operating mode.

In the second operating mode of the particle beam system 1, the electron beam 21 can continue to be directed into the common work region 53 onto the object 23 through the opening 63 of the end cap 61. In addition, the ion beam 51 can continue to be directed into the common work region 53 onto the object 23. In other words, a common work region 53 of the electron beam column 3 and of the ion beam column 5 is present even in the second operating mode.

In the second operating mode of the particle beam system 1, the end cap 61 has the effect that the electrostatic field produced by the first electrode 35 and the second electrode 37 between the electrode 37 and the object 23 is weaker in the common work region 53 as compared to the case in which the particle beam system 1 is in the first operating mode. Even though the end cap 61 weakens the electrostatic field, an electrostatic field which is weakened compared to the first operating mode still passes through the opening 63 of the end cap 61, such that secondary particles coming from the object 23 continue to be accelerated, although not as efficiently, to the exit opening 41 of the electron beam column 3 and thus to the first detector 39 and the second detector 45. Therefore, the resolution of the electron beam column 3 that is achievable in the second operating mode is lower than in the first operating mode.

On the other hand, the electrostatic field which is weakened as compared to the first operating mode has, in the second operating mode, less of an effect on the beam path of the ion beam 51, which means that the ion beam can be directed onto the object 23 with a greater precision than in the first operating mode.

The electron beam 21 and the ion beam 51 can, both in the first operating mode of the particle beam system 1, shown in FIG. 1, and also in the second operating mode of the particle beam system 1, shown in FIG. 2, be directed onto the same region of the object 23 one after the other or at the same time, first to produce image data based on the detected secondary particles that represent an image of the object 23 and, second, to process the object 23 with the ion beam 51. The secondary particles used to produce the image data can be produced by the interaction of the electron beam 21 with the object 23 or by the interaction of the ion beam 51 with the object 23 or can be produced by the interaction of both the electron beam 21 and the ion beam 51 with the object 23.

The particle beam system 1 can furthermore include a controller (not illustrated in the figures) which can control the electron beam column 3, the ion beam column 5 and the movement apparatus 65. In particular, the controller is configured to bring the particle beam system 1 into the first operating mode. This is accomplished by arranging the end cap 61 outside the beam path 22 of the electron beam 21, as is illustrated by way of example in FIG. 1. Furthermore, the controller can bring the particle beam system 1 into the second operating mode. This is accomplished by arranging the end cap between the electron beam column 3 and the common work region 53. In particular, the end cap 61 is arranged such that the beam path 22 of the electron beam 21 can pass through the opening 63 of the end cap 61 and that secondary particles coming from the common work region 53 can pass through the opening 63 of the end cap 61 to one of the detectors 39, 45 of the electron beam column 3.

Furthermore, the controller is configured to control the particle beam system 1 in a manner such that it performs the methods described here.

In FIGS. 1 and 2, the object 23 is illustrated as being oriented substantially orthogonally to the first particle beam column (electron beam column 3). In various applications of the particle beam system 1, the object 23 can, however, also be oriented substantially orthogonally to the second particle beam column (ion beam column 5). Both the first sequence and the second sequence can include moving the object in a manner such that the object is oriented substantially orthogonally to the main axis 55 of the first particle beam column 3 or substantially orthogonally to the main axis 57 of the second particle beam column 5.

Figure 3:
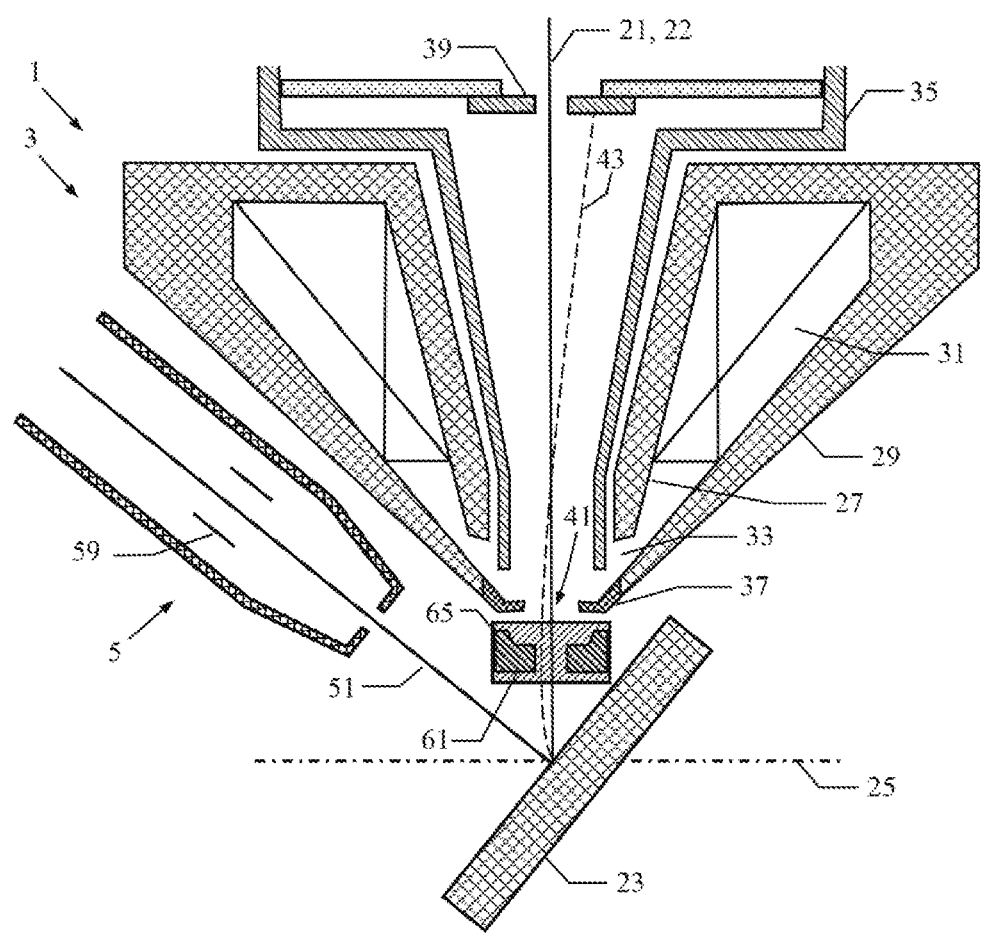
FIG. 3 shows a second illustration of the particle beam system shown in FIG. 1 in a second operating mode.

FIG. 3 illustrates a detail of the particle beam system 1 in the second operating mode, wherein the object 23 is oriented substantially orthogonally to the second particle beam column (ion beam column 5). Rather than arranging the movement apparatus 65 in the manner shown in FIGS. 1 and 2, it may be advantageous to arrange it along a direction that is oriented both transversely (in particular substantially orthogonally) to the main axis 55 of the first particle beam column (electron beam column 3) and transversely (in particular substantially orthogonally) to the main axis 57 of the second particle beam column (ion beam column 5), as is indicated in FIG. 3. In this way, it is possible to prevent a collision between the object 23 and the movement apparatus 65. The orientation of the object 23, however, is not limited to a substantially orthogonal orientation relative to the first particle beam column 3 and/or to the second particle beam column 5. Rather, the object 23 can have any conceivable/possible orientation. In particular, the object 23 in the first sequence can remain in one orientation relative to the first particle beam column 3 and/or to the second particle beam column 5 or be brought into different orientations. Furthermore, the object 23 can also remain in one orientation relative to the first particle beam column 3 and/or to the second particle beam column 5 or be brought into different orientations in the second sequence. In particular, the orientations in the first and second sequences can differ from one another or be the same.

Figure 4:
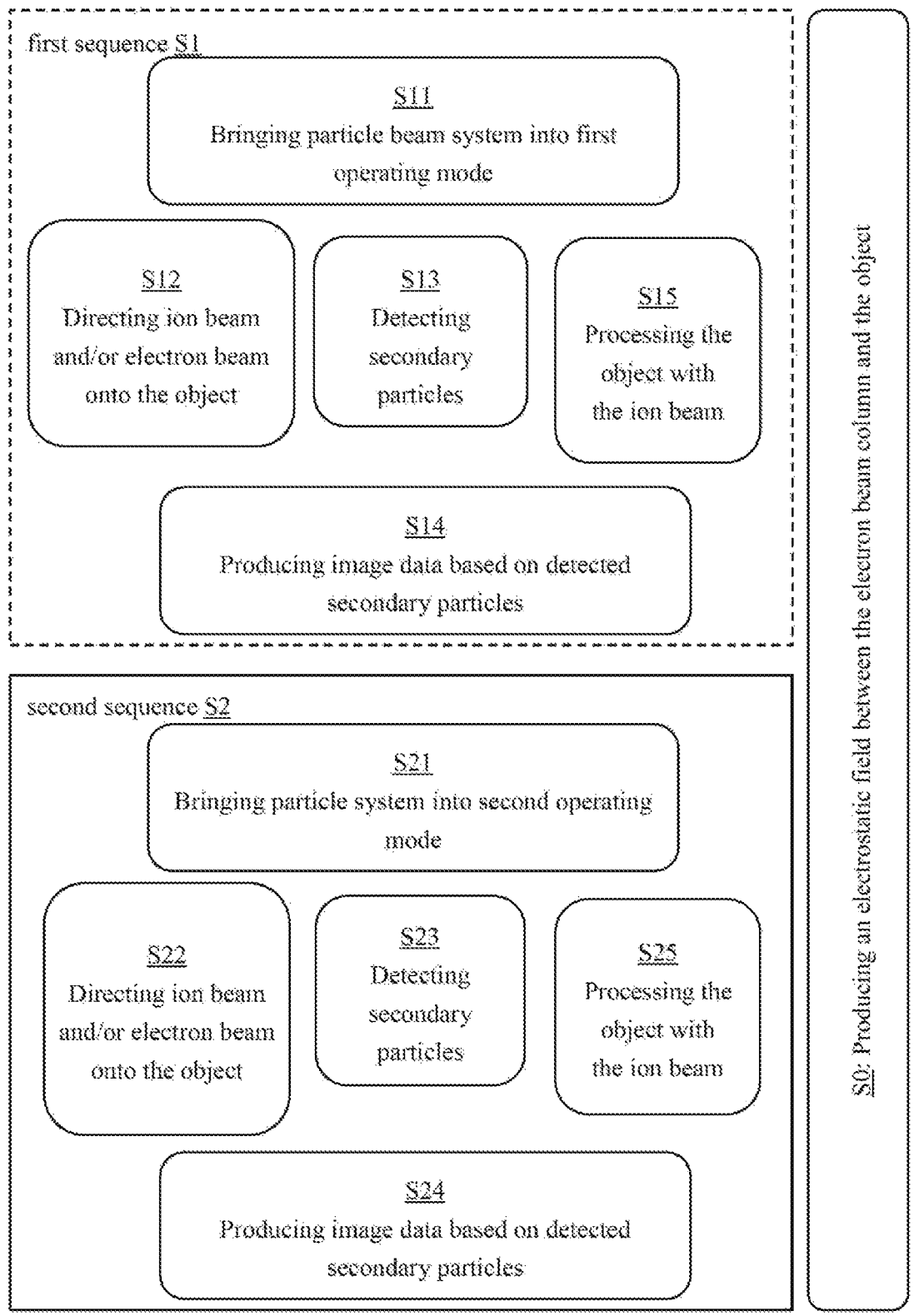
FIG. 4 shows possible steps for methods for operating the particle beam system shown in FIGS. 1 to 3.

With respect to FIGS. 4 and 5, methods will be described below that can be performed with the particle beam system 1. FIG. 4 shows an exemplary compilation of steps that can be part of a method.

An exemplary method includes a first sequence S1 and a second sequence S2. The steps of the first sequence are performed while the particle beam system 1 is in the first operating mode; and the steps of the second sequence are performed while the particle beam system 1 is in the second operating mode. Exceptions here are merely the transition of the particle beam system between the operating modes.

The first sequence S1 can include, as the first step S11, bringing the particle beam system 1 into the first operating mode. In the first operating mode, the electron beam column 3 operates with very high precision owing to the electrostatic field between the electron beam column 3 and the object 23 (or in the common work region 53) that is strong compared to the second operating mode. By contrast, the ion beam column 5 operates with reduced precision as compared to the second operating mode owing to the strong electrostatic field.

After the particle beam system 1 has been brought into the first operating mode (S11), the steps which are described below can be performed in the first sequence. For example, the electron beam 21 or the ion beam 51, or both, are directed onto the object 23 to produce secondary particles (S12). The secondary particles can be detected using the detectors 39, 45 arranged in the electron beam column 3 (S13). Image data that represent an image of the object 23 can be produced based on the detected secondary particles (S14). The progress of the processing of the object 23 can be assessed and controlled based on the image data.

Before, after or at the same time, the ion beam can be directed onto the object 23 so as to process it, that is to say to remove material therefrom or to cut off material therefrom with the addition of a process gas (S15).

For the duration of the first sequence, an electrostatic field that contributes to the improvement of the detection of the secondary particles can be produced S0 between the electron beam column 3 and the object 23 (or in the common work region 53) (S13).

Depending on the application, the first sequence 51 includes only parts of the aforementioned steps S12 to S14. For example, the object 23 is not processed with the ion beam 51 during the first sequence; rather, merely image data of the object 23 are produced (S14) by detecting secondary particles (S13) that are produced using the electron beam 21 and/or using the ion beam 51 (S12). Consequently, only the advantage of the first operating mode is used here, according to which the electron beam column 3 operates with very high precision.

The steps of the first sequence S1 can be performed a plurality of times within the first sequence, and can in particular be repeated. For example, first the electron beam 21 is directed onto the object (S12) to produce image data (S14). For the subsequent processing of the object with the ion beam, the parameters are determined on the basis of the image data for the first sequence (S15). After processing of the object 23 in the first sequence using the ion beam 51 (S15), the electron beam 21 can again be directed onto the object (S12) to again produce image data (S14) with which the object will again be processed using the ion beam 51 (S15). Accordingly, the steps of the first sequence S1 can be repeated a number of times before the first sequence S1 is ended and the second sequence S2 takes place.

The second sequence S2 can be performed before and/or after the first sequence S1.

The second sequence S2 can include, as the first step, bringing the particle beam system 1 into the second operating mode (S21). In the second operating mode, the electron beam column 3 operates with less precision owing to the electrostatic field between the electron beam column 3 and the object 23 (or in the common work region 53) that is weak compared to the first operating mode. By contrast, the ion beam column 5 operates with very high precision as compared to the first operating mode owing to the weakened electrostatic field.

After the particle beam system 1 has been brought into the second operating mode (S21), the steps which are described below can be performed in the second sequence S2. For example, the electron beam 21 or the ion beam 51, or both, are directed onto the object 23 to produce secondary particles (S22). The secondary particles can be detected using the detectors 39, 45 arranged in the electron beam column 3 (S23). Image data that represent an image of the object 23 can be produced based on the detected secondary particles (S24). The progress of the processing of the object 23 can be assessed and controlled based on the image data.

Before, after or at the same time, the ion beam can be directed onto the object 23 so as to process it, that is to say to remove material therefrom or to cut off material therefrom with the addition of a process gas (S25).

For the duration of the second sequence S2, an electrostatic field that, although weakened in the common work region as compared to the first operating mode owing to the end cap, still contributes to the improvement of the detection of the secondary particles can be produced (S0) between the electron beam column 3 and the object 23 (or in the common work region 53).

Depending on the application, the second sequence S2 includes only parts of the aforementioned steps S22 to S25. For example, the object 23 is only processed with the ion beam 51 (S25) during the second sequence S2; and no image data of the object 23 are produced (S24). Consequently, only the advantage of the second operating mode is used, according to which the ion beam column 5 operates with very high precision.

The steps of the second sequence S2 can be performed a plurality of times within the second sequence S2, and can in particular be repeated. For example, first the electron beam 21 is directed onto the object to produce image data (S22). For the subsequent processing of the object with the ion beam, the parameters are determined on the basis of the image data for the second sequence (S25). After processing of the object 23 in the second sequence using the ion beam 51 (S25), the electron beam 21 can again be directed onto the object (S22) to again produce image data (S24) with which the object will again be processed using the ion beam 51 (S25). Accordingly, the steps of the second sequence S2 can be repeated a number of times before the second sequence S2 is ended and the first sequence 51 takes place.

The image data recorded during the first sequence S1 (S14) can be used to control the electron beam 21 and/or the ion beam 51 in the first and second sequences (S12, S15, S22, S25). The image data recorded during the second sequence S2 (S24) can likewise be used to control the electron beam 21 and/or the ion beam 51 during the first and second sequences (S12, S15, S22, S25).

Figure 5:
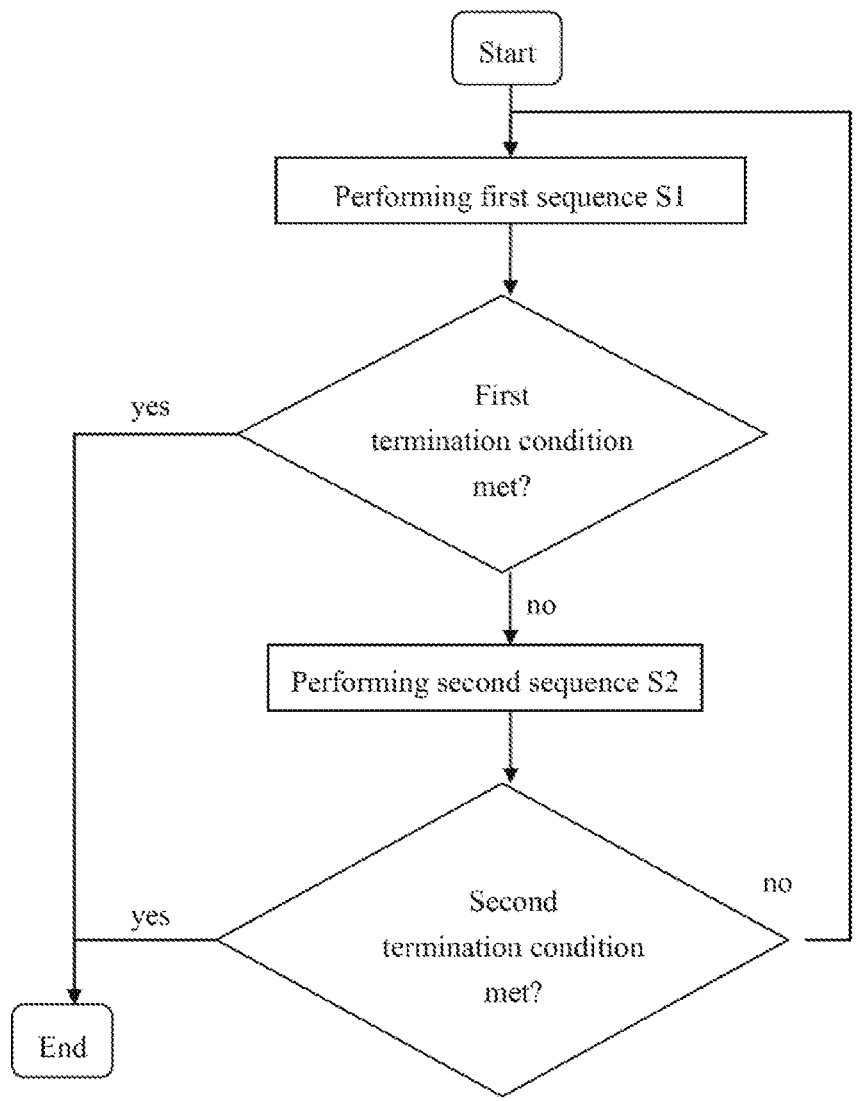
FIG. 5 shows a further embodiment of a method for operating the particle beam system shown in FIGS. 1 to 3.

FIG. 5 shows a further exemplary method for operating the particle beam system 1. The method begins by the steps of the first sequence being performed. After the first sequence, a check is performed as to whether a first termination condition has been met. The first termination condition depends on what type of object is to be produced or on how the object is to be processed. For example, an assessment is made on the basis of the image data recorded in the first sequence as to whether the object has a desired shape. The first termination condition can also be that the object is processed and analysed to a predefined extent.

If the first termination condition has been met, the method ends. If the first termination condition has not been met, the steps of the second sequence are performed.

After the steps of the second sequence have been performed, a check is carried out as to whether a second termination condition has been met. The second termination condition can be the same as the first termination condition, but it can also differ from the first termination condition.

If the check of the second termination condition indicates that the second termination condition has been met, the method is ended. If the check of the second termination condition indicates that the second termination condition has not been met, the method is continued with the first sequence.

According to a modification of the method illustrated in FIG. 5, the check of the first or second termination condition can be omitted.

What is claimed is:

1. A method of operating a particle beam system comprising first and second particle beam columns having a common work region, the first particle beam column being configured to produce a first particle beam, the second particle beam column being configured to produce a second particle beam, the first particle beam column comprising a detector within the first particle beam column and configured to detect secondary particles, the particle beam system further comprising an end cap having an opening, the end cap arranged, in a first operating mode of the particle beam system, outside a beam path of the first particle beam, and the end cap configured, in a second operating mode of the particle beam system, so that the beam path of the first particle beam extends through the opening of the end cap so that secondary particles coming from the common work region pass through the opening of the end cap to reach the detector, the method comprising:
   while the particle beam system is in the first operating mode, using the detector to detect secondary particles coming from an object in the common work region; and
   while the particle beam system is in the second operating mode, using the second particle beam to process the object.

2. The method of claim 1, comprising, while the particle beam system is in the second operating mode, using the second particle beam to process the object based on the secondary particles that were detected while the particle beam system was in the first operating mode.

3. The method of claim 1, further comprising producing an electrostatic field via the first particle beam column for the duration of the first and second operating modes, wherein the electrostatic field decelerates or accelerates the first particle beam.

4. The method of claim 3, further comprising keeping a voltage producing the electrostatic field substantially constant for the duration in which the particle beam system is in the first and second operating modes.

5. The method of claim 3, comprising producing the electrostatic field so at least a portion of the electrostatic field is situated between an exit opening, through which the first particle beam exits the first particle beam column, and the object while the particle beam system is in the first operating mode.

6. The method of claim 5, further comprising bringing the particle beam system into the second operating mode by arranging the end cap between the exit opening and the object.

7. The method of claim 3, further comprising, while the particle beam system is in the second operating mode, arranging the end cap to reduce the strength of the electrostatic field in the common work region compared when the particle beam system was in the first operating mode.

8. The method of claim 1, further comprising, before using the detector to detect secondary particles coming from the object in the common work region, bringing the particle beam system into the first operating mode by arranging the end cap outside the beam path of the first particle beam.

9. The method of claim 1, further comprising bringing the particle beam system into the second operating mode by arranging the end cap between the first particle beam column and the common work region.

10. The method of claim 1, wherein:
    the method comprises a first operating sequence;
    the first operating sequence comprises, while the particle beam system is in the first operating mode, using the detector to detect secondary particles coming from the object in the common work region; and
    the first operating sequence further comprises at least one of the following:
      producing image data representing an image of the object based on the secondary particles that were detected in the first sequence;
      directing the second particle beam and/or the first particle beam onto the object while the particle beam system is in the first operating mode to produce the secondary particles coming from the object; and
      processing the object with the second particle beam, while the particle beam system is in the first operating mode.

11. The method of claim 10, wherein processing the object with the second particle beam, while the particle beam system is in the first operating mode, is based on the image data produced in the course of the first sequence.

12. The method of claim 10, wherein:
    the method comprises a second operating sequence;
    the second operating sequence comprises, while the particle beam system is in the second operating mode, using the second particle beam to process the object; and
    the second operating sequence further comprises at least one of the following:
      detecting the secondary particles that are coming from the object and pass through the opening of the end cap using the detector while the particle beam system is in the second operating mode;
      producing image data representing an image of the object based on the secondary particles that were detected in the second sequence; and
      directing the second particle beam and/or the first particle beam that travels through the opening of the end cap onto the object while the particle beam system is in the second operating mode to produce the secondary particles coming from the object.

13. The method of claim 1, wherein:
    the method comprises a second operating sequence;

the second operating sequence comprises, while the particle beam system is in the second operating mode, using the second particle beam to process the object; and the second operating sequence further comprises at least one of the following:
  detecting the secondary particles that are coming from the object and pass through the opening of the end cap using the detector while the particle beam system is in the second operating mode;
  producing image data representing an image of the object based on the secondary particles that were detected in the second sequence; and
  directing the second particle beam and/or the first particle beam that travels through the opening of the end cap onto the object while the particle beam system is in the second operating mode to produce the secondary particles coming from the object.

14. The method of claim 1, wherein:
the method comprises first and second operating sequences;
the first operating sequence comprises, while the particle beam system is in the first operating mode, using the detector to detect secondary particles coming from the object in the common work region;
the second operating sequence comprises, while the particle beam system is in the second operating mode, using the second particle beam to process the object;
at least one of the following holds:
  the first sequence is performed before the second sequence;
  the first sequence is performed after the second sequence; and
  the first and second sequences are repeated successively in alternation until a termination condition has been met.

15. The method of claim 1, wherein the first particle beam is an electron beam or an ion beam, and wherein the second particle beam is an electron beam or an ion beam.

16. A particle beam system, comprising:
a first particle beam column configured to produce a first particle beam, the first particle beam column comprising a detector within the particle beam column;
an end cap having an opening therein;
a second particle beam column configured to produce a second particle beam; and
a controller,
wherein:
  the first and second particle beam columns have a common work region;
  the detector is configured to detect secondary particles;
  in a first operating mode of the particle beam system, the end cap is outside a beam path of the first particle beam;
  in a second operating mode of the particle beam system, the end cap is configured so that the beam path of the first particle beam extends through the opening of the end cap so that secondary particles coming from the common work region pass through the opening of the end cap to reach the detector; and
  the controller which is configured to control the particle beam system so that:
    while the particle beam system is in the first operating mode, the detector detects secondary particles coming from an object in the common work region; and
    while the particle beam system is in the second operating mode, the second particle beam processes the object.

17. The particle beam system of claim 16, wherein the controller is configured so that, while the particle beam system is in the second operating mode, the second particle beam processes the object based on the secondary particles that were detected while the particle beam system was in the first operating mode.

18. The particle beam system of claim 16, further comprising producing an electrostatic field via the first particle beam column for the duration of the first and second operating modes, wherein the electrostatic field decelerates or accelerates the first particle beam.

19. The particle beam system of claim 16, further comprising keeping a voltage producing the electrostatic field substantially constant for the duration in which the particle beam system is in the first and second operating modes.

20. A method, comprising:
a) providing a particle beam system, comprising:
  a first particle beam column configured to produce a first particle beam, the first particle beam column comprising a detector within the particle beam column;
  an end cap having an opening therein; and
  a second particle beam column configured to produce a second particle beam,
  wherein:
    the first and second particle beam columns have a common work region;
    the detector is configured to detect secondary particles;
    in a first operating mode of the particle beam system, the end cap is outside a beam path of the first particle beam;
    in a second operating mode of the particle beam system, the end cap is configured so that the beam path of the first particle beam extends through the opening of the end cap so that secondary particles coming from the common work region pass through the opening of the end cap to reach the detector;
b) while the particle beam system is in the first operating mode, using the detector to detect secondary particles coming from an object in the common work region; and
c) while the particle beam system is in the second operating mode, using the second particle beam to process the object.

21. The method of claim 20, comprising, while the particle beam system is in the second operating mode, using the second particle beam to process the object based on the secondary particles that were detected while the particle beam system was in the first operating mode.

* * * * *

UNITED STATES PATENT AND TRADEMARK OFFICE
CERTIFICATE OF CORRECTION

PATENT NO. : 10,984,983 B2
APPLICATION NO. : 16/705953
DATED : April 20, 2021
INVENTOR(S) : Björn Gamm and Marko Matijevic Page 1 of 1

It is certified that error appears in the above-identified patent and that said Letters Patent is hereby corrected as shown below:

In the Specification

Column 1, Line 10, delete "2019." and insert -- 2018. --.

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*